(12) United States Patent
Santiago-Berrios et al.

(10) Patent No.: US 10,128,390 B2
(45) Date of Patent: Nov. 13, 2018

(54) LEAD SELENIDE CAPPED WITH A BENZOATE LIGAND

(71) Applicants: Mitk'El B. Santiago-Berrios, Caguas, PR (US); Weyshla A. Rodriguez-Rodriguez, Trujillo Alto, PR (US)

(72) Inventors: Mitk'El B. Santiago-Berrios, Caguas, PR (US); Weyshla A. Rodriguez-Rodriguez, Trujillo Alto, PR (US)

(73) Assignee: Ana G. Mendez University System, San Juan, PR (US)

( * ) Notice: Subject to any disclaimer, the term of this patent is extended or adjusted under 35 U.S.C. 154(b) by 19 days.

(21) Appl. No.: 15/334,195

(22) Filed: Oct. 25, 2016

(65) Prior Publication Data

US 2017/0040474 A1 Feb. 9, 2017

Related U.S. Application Data

(62) Division of application No. 14/555,567, filed on Nov. 26, 2014, now Pat. No. 9,505,618.

(Continued)

(51) Int. Cl.
 *H01L 31/0216* (2014.01)
 *H01L 31/0328* (2006.01)
(Continued)

(52) U.S. Cl.
 CPC ........ *H01L 31/0328* (2013.01); *C01B 19/007* (2013.01); *H01L 31/0216* (2013.01);
(Continued)

(58) Field of Classification Search
 CPC ............. Y10S 977/932; Y10S 977/774; H01L 31/0216; H01L 31/0328; H01L 31/0324;
(Continued)

(56) References Cited

U.S. PATENT DOCUMENTS

2010/0113813 A1* 5/2010 Pickett ................. B82Y 30/00
556/9
2013/0048922 A1 2/2013 Zhoug

OTHER PUBLICATIONS

Kovalenko et al. "Quasi-Seeded Growth of Ligand-Tailored PbSe Nanocrystals through Cation-Exchange-Mediated Nucleation" Angew. Chem. Int. Ed. 2008, 47, 3029-3033.*

(Continued)

*Primary Examiner* — Amber R Orlando
*Assistant Examiner* — Syed T Iqbal
(74) *Attorney, Agent, or Firm* — DBPR Legal LLC; Walter O. Alomar-Jimenez, Esq.

(57) ABSTRACT

Semiconductor materials offer several potential benefits as active elements in the development of harvesting-energy conversion technologies. In particular, lead selenide (PbSe) semiconductors have been used and proposed to design solar energy harvesting devices, IR sensors, FET devices, amongst others. The present disclosure provides a lead selenide capped with an aromatic ligand. The use of an aromatic ligand, and more specifically benzoic acid, provides robustness and more durability to the lead selenide, and therefore prevents the lead selenide from breaking or cracking easily. Also the aromatic ligand prevents the degradation and oxidation of the lead selenide, without affecting any of the lead selenide electronic and chemical characteristics.

8 Claims, 3 Drawing Sheets

Related U.S. Application Data

(60) Provisional application No. 61/909,770, filed on Nov. 27, 2013.

(51) Int. Cl.
  *C01B 19/00* (2006.01)
  *H01L 31/0272* (2006.01)
  *H01L 31/032* (2006.01)
  *B82Y 30/00* (2011.01)

(52) U.S. Cl.
  CPC ...... *H01L 31/0272* (2013.01); *H01L 31/0324* (2013.01); *B82Y 30/00* (2013.01); *C01P 2002/72* (2013.01); *C01P 2002/82* (2013.01); *C01P 2004/03* (2013.01); *C01P 2006/40* (2013.01); *Y02P 20/134* (2015.11); *Y10S 977/774* (2013.01); *Y10S 977/932* (2013.01)

(58) Field of Classification Search
  CPC ... H01L 31/0272; B82Y 30/00; C01B 19/007; C01P 2002/72; C01P 2002/82; C01P 2006/40; C01P 2004/03; Y02P 20/134
  See application file for complete search history.

(56) References Cited

OTHER PUBLICATIONS

Rodriguez-Rodriguez, et.al., Synthesis, characterization and electrochemical characterization of lead selenide sub-micron particles capped with a benzoate ligand and prepared at different temperatures, Material Express Journal, Sep. 19, 2014, vol. 1 No. 3.

\* cited by examiner a) 100°C   b) 150°C   c) 250°C

LEAD SELENIDE CAPPED WITH A BENZOATE LIGAND

RELATED APPLICATIONS

Provisional application No. U.S. 61/909,770 filed on Nov. 27, 2013.

Nonprovisional application. No. U.S. Ser. No. 14/555,567 filed on Nov. 26, 2014.

STATEMENT REGARDING FEDERALLY SPONSORED RESEARCH AND DEVELOPMENT

This work was supported by the Institute for Functional Nanomaterials under the PR-EPSCoR program (NSF Grant No. EPS-1002410) and NSF Grant No. CBET-1126339.

BACKGROUND OF THE DISCLOSURE

Field of the Disclosure

The present invention relates to a method a lead selenide containing aromatic ligands, and more specifically the present invention relates to a lead selenide containing benzoic acid. Said lead selenide is used in the manufacturing of IR detectors, semiconductors, solar cells, amongst others.

Definitions

Closed environment: a reaction carried in an inert environment, without the presence of oxygen and moisture in the air. Usually the reaction vessel is filled with an inert gas such as nitrogen or argon. The inert gas prevents unwanted chemical reactions with the sample such as oxidation and hydrolysis, which are reactions with the oxygen and moisture in air.

Opened environment: a reaction carried in the presence of the oxygen and moisture in the air. The reaction vessel does not need to be filled with an inert gas.

Discussion Of The Background

Semiconductor materials offer several benefits as active elements in the development of the next-generation technologies for solar energy conversion. The systematic design of a solar energy harvesting device requires an understanding of the chemistry of the counterparts of the device. For instance, semiconductor thin films offer an efficient light capture due to the high absorption cross section of the inorganic materials. However, they have not yet been successfully used for the construction of a hybrid interface sufficiently robust and efficient for industrial applications. Among the various semiconductors under investigation, lead salts, particularly quantum dots have drawn particular attention from the applied and fundamental research communities, primarily for its exceptionally strong quantum confinement effects.

Lead salts, particularly lead selenide (PbSe) and lead sulfur (PbS) have shown interesting properties that make them suitable for these applications. Among these properties are their potential as fluorophores and the narrow bad gap that these materials exhibit. Other reason why lead salts have attracted such interest is that these materials absorb in the infrared region, which represents almost 50% of the solar spectrum, allowing them to be used in solar cells, FET devices, and other devices. Recently, PbSe quantum dots (QD) have attracted greater interest because they absorb in the mid-infrared region, while having a low effective mass and large exciton Bohr radius.

To increase the rate of charge transfer mechanisms between the semiconductor core and the ligands that are attached to the surface of these particles in solar energy harvesting devices, several methods have been proposed using mainly ligand exchange methods after the synthesis of the semiconductor. Most of the solar energy harvesting devices and optoelectronic applications have shown that the conduction across the different components of the device can be inhibited by long insulating organic ligands that are used during the synthesis, for example trioctylphosphine and oleic acid. Nevertheless, said synthesis requires a two-step process for a ligand exchange reaction. Because it is a two-step process, it can be expensive and time consuming, specifically due to the fact that the reaction is carried in a close environment to prevent the oxidation of the lead selenide.

Other works have used aromatic ligands in semiconductors. However, the synthesis of lead selenide semiconductors with aromatic ligands has been elusive so far. Tan and coworkers have derivatized cadmium selenide (CdSe) with thiophenol and with 4-dimethylaminothiophenol in a two-step reaction. Tan et. al observed that the aromatic ligands provide excellent protection against air and water oxidation. More recently, Debnath and coworkers prepared lead sulfide (PbS) nanoparticles with N-2,4,6-trimethylphenyl-N-methyldithiocarbamate ligands in a two-step reaction. The presence of the aromatic compound also helps to prevent air oxidation of the particle in the construction of a solar cell.

The prior art discloses methods for synthesizing lead selenide using oleic acid as the capping ligand. However, said ligand does not adequately protect the lead from oxidation. The main difference between oleic acid and benzoic acid relies on the chemical structure. Oleic acid is an 18 carbon chain with an unsaturation at the ninth carbon (see FIG. 1). Benzoic acid on the contrary is a smaller molecule with a benzene ring. Oxidation of the lead will have two primary disadvantages: i) it decreases the rate of charge transfer; and ii) it is more amenable to crack or break. Therefore, there is a need to synthesize a lead selenide which will not easily oxidize, thus providing semiconductors, solar cells, FET devices, IR detectors and others with better rate of charge transfer and more durability. The synthesis of lead selenide using oleic acid is carried in a closed environment to prevent the oxidation of the lead selenide.

The prior art also discloses the use of aromatic ligands, more particularly, thiophenol, 4-dimethylaminothiophenol and N-2,4,6-trimethylphenyl-N-methyldithiocarbamate, in a two-step process using ligand exchange methods. This means that the prior art discloses the synthesis of lead selenide in an inert, closed environment usually using an inert gas to prevent the oxidation of the lead selenide and afterwards a ligand exchange reaction with the desired aromatic ligand. Therefore, there is a need to provide a simple and low cost process to synthesize lead selenide, which can be done in an opened environment.

SUMMARY

The current disclosure presents a lead selenide capped with an aromatic ligand.

The current disclosure presents a lead selenide containing an aromatic ligand as the capping ligand, which is synthesized in an opened environment.

The current disclosure presents a lead selenide capped with benzoic acid.

The current disclosure presents a lead selenide containing benzoic acid as the capping ligand.

The current disclosure presents a lead selenide containing benzoic acid as the capping ligand, which is synthesized in an opened environment.

Accordingly, it is an object of the present disclosure to provide a lead selenide containing aromatic ligands in the crystal structure of the PbSe.

Accordingly, it is an object of the present disclosure to provide a lead selenide containing benzoic acid in the crystal structure of the PbSe.

It is another object of the present disclosure to provide an aromatic ring to the lead selenide in such way that the lead selenide's electrochemical behavior occurs in negative potentials and, therefore, said lead selenide is resistant to oxidation.

It is another object of the present disclosure to provide an aromatic ring to the lead selenide in such way that will provide robustness, more durability and prevent oxidation of the particle.

It is another object of the present disclosure to provide a benzoic acid ring to the lead selenide in such way that will provide robustness, more durability and prevent oxidation of the particle.

It is another object of the present disclosure to provide an aromatic ring to the lead selenide in such way that will provide robustness, more durability and prevent oxidation of the particle, while not affecting any of the lead selenide electronic and chemical characteristics.

It is another object of the present disclosure to provide a benzoic acid ring to the lead selenide in such way that will provide robustness, more durability and prevent oxidation of the particle, while not affecting any of the lead selenide electronic and chemical characteristics.

It is another object of the present disclosure to provide a simple and low cost process for the synthesis of a lead selenide capped with an aromatic ligand, which can be synthesized in an opened environment.

BRIEF DESCRIPTION OF THE DRAWINGS

The accompanying drawings, which are incorporated herein, constitute part of the specification and illustrate the preferred embodiment of the disclosure.

DESCRIPTION OF THE PREFERRED EMBODIMENT

Figure 1:
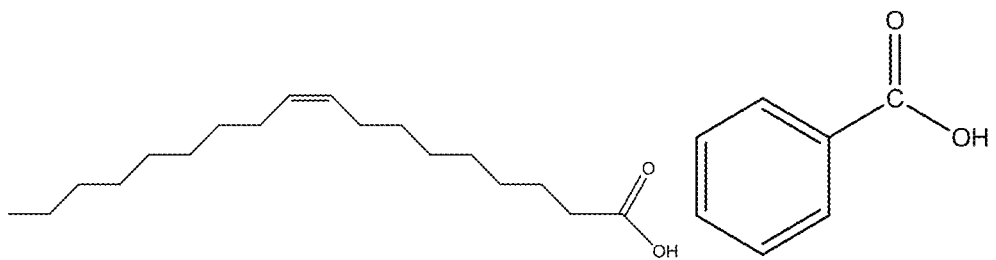
FIG. 1 shows the chemical structure of oleic acid (left) and benzoic acid (right).

Lead acetate (reagent grade) and toluene (reagent grade) were obtained from Fisher Scientific. On the other hand, the elemental selenium (99.999% pure), 1-octadecene, benzoic acid, and trioctylphosphine were obtained from Sigma-Aldrich.

The synthesis of PbSe with benzoic acid as a capping ligand is carried at about 200° C. temperature, preferably at 250° C., via nucleation (bottom-up method) in an opened environment comprising the following steps:

Step 1: In a round bottom flask stoichiometric amounts of lead acetate, preferably 3.795 grams, and recrystallized benzoic acid, preferably 1.8349 grams, are added to 40 mL of a 50:50 mixture of toluene and 1-octadecene in an opened environment. This reaction mixture is heated at about 200° C. temperature, preferably at 250° C., and maintained at constant stirring for about one hour. This generates a lead benzoate solution.

Step 2: In another round bottom flask an stoichiometric amount of selenium powder with respect to the lead acetate of Step 1, preferably 0.0690 grams, and 1.6 mL of trioctylphosphine is added to 40 mL of 1-octadecene and heated at about 200° C. temperature, preferably at 250° C., at constant stirring in an opened environment for about 20 to 30 minutes. This generates a selenide solution.

Step 3: Adding five milliliters (5 mL) of the lead benzoate solution of Step 1 into the selenide solution of Step 2 at a rate of 1 mL per 30 seconds. This generates a lead selenide with benzoic ligand and a byproduct.

Step 4: When the addition of Step 3 is completed, the byproduct is decanted and the lead selenide with benzoic ligand is centrifuged for 15 minutes with ethanol.

Step 5: The ethanol is decanted and the lead selenide with benzoic ligand were re-suspended in hexane at room temperature.

Characterization

A lead selenide containing aromatic ligand is provided in the present disclosure, and more particularly, a lead selenide containing benzoic acid as the capped ligand.

Also, a simple, low cost, opened environment method for synthesizing PbSe particles using benzoic acid as the capping ligand has been provided according to the principles of the present invention.

The lead selenide of the present disclosure were compared with PbSe using oleic acid as the capping ligand.

Figure 2:
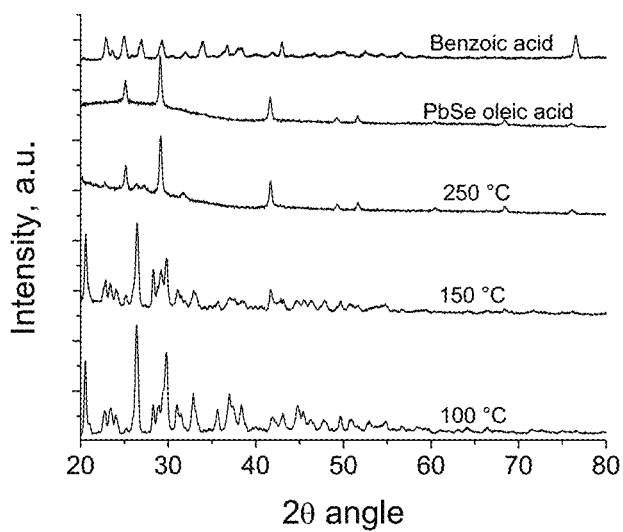
FIG. 2 shows a comparison of X-ray powder diffractograms (XRPD) between PbSe particles with benzoic acid ligands synthesized at 100° C., 150° C. and 250° C. XRPD of PbSe with oleic acid ligand and benzoic acid are also shown for comparison in accordance with the principles of the present disclosure.

In FIG. 2, we can observe that the diffraction pattern of lead selenide with benzoic acid prepared at 100° C. and 150° C. are very different from the diffraction pattern of PbSe with oleic acid. However, only the synthesis of PbSe with benzoic acid prepared at 250° C. temperature resembles the crystal structure of PbSe oleic acid.

Figure 3:
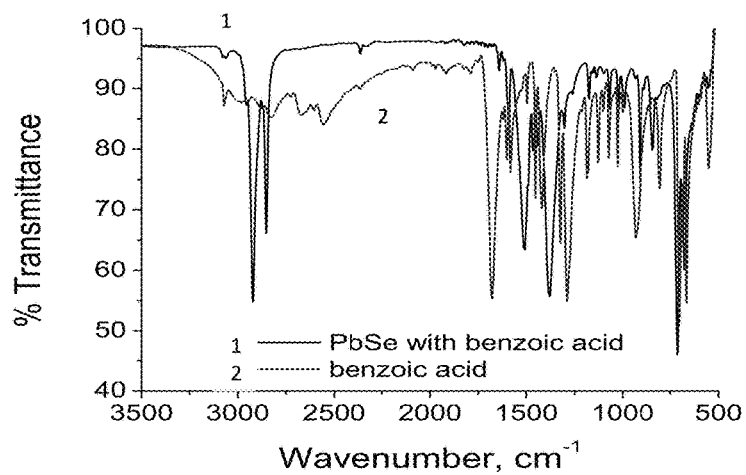
FIG. 3 shows an IR spectra of benzoic acid and of PbSe with benzoic acid as the capping ligand in accordance with the principles of the present disclosure.

FIG. 3 shows the IR spectra of benzoic acid as well as for the PbSe with benzoic acid as the capping ligand. The IR spectrum of benzoic acid shows the acidic —OH stretch at 3071 $cm^{-1}$ and the C=O stretch at 1670 $cm^{-1}$. Other bands are also present which are characteristic of this aromatic carboxylic acid compound. However, is very interesting that upon complexation of benzoic acid with PbSe (particularly with $Pb^{+2}$), the IR spectrum shows that the —OH stretch at 3071 $cm^{-1}$ is not present. This indicates complete complexation between the carboxylate group with the PbSe particle. To corroborate this finding, we also observed that the intensity of C=O stretching peak at 1670 cm$^{-1}$ was dramatically reduced, while the peak of the aromatic C=C vibrational stretch is present around 1500 cm$^{-1}$.

Figure 4:
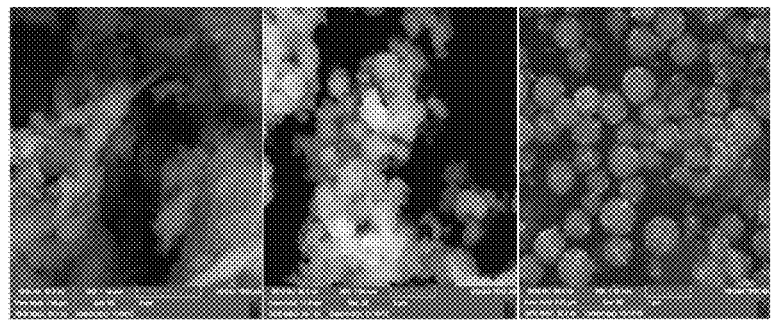
FIG. 4 shows a secondary electron detector SEM micrographs of PbSe with benzoic acid ligand at a) 100° C., b) 150° C. and c) 250° C. on a carbon tape substrate in accordance with the principles of the present disclosure.

FIG. 4 shows secondary electron detector SEM micrographs of PbSe with benzoic acid prepared at 100° C., 150° C. and 250° C. As can be observed in FIG. 4, the synthesis of PbSe with benzoic acid at 100° C. produces particles that have more like a laminar structure rather than crystals. When the temperature was increased during the synthesis, some agglomeration is observed. However, at 250° C. particles are present showing a spherical shape. The mean size of PbSe particles with benzoic acid prepared at 250° C. is around 500 nm as determined by SEM, which corroborates our previous results obtained in our XRPD studies (FIG. 2).

Figure 5:
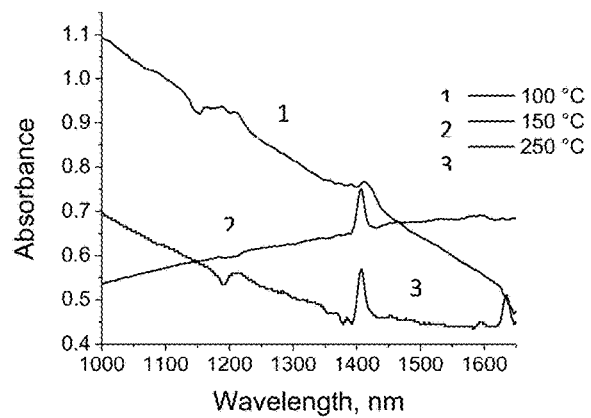
FIG. 5 shows an NIR absorption spectra of synthesized PbSe with benzoic acid at 100° C., 150° C. and 250° C. in accordance with the principles of the present disclosure.

FIG. 5 shows that PbSe with benzoic acid retained their electronic properties. PbSe with benzoic acid have a λmax around 1403 and 1630 nm, which are in agreement with previous results using oleic acid as the capping ligand.

Electrochemical Studies

Figure 6:
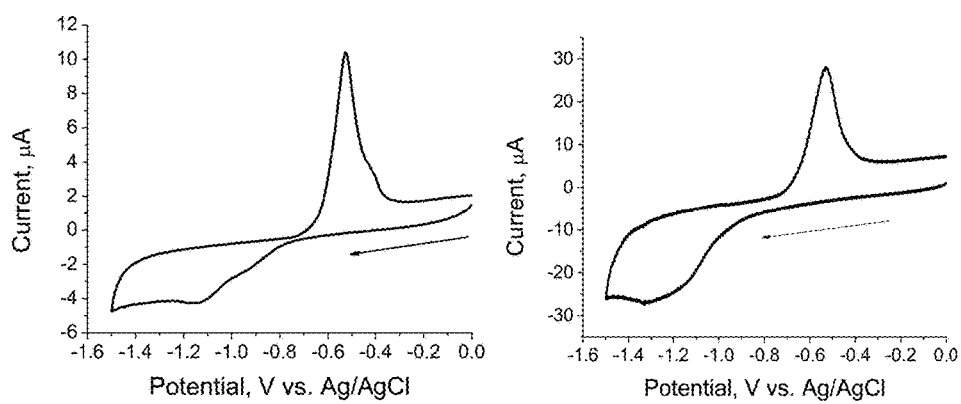
FIG. 6 shows a Cyclic voltammograms of PbSe with benzoic acid ligand on a glassy carbon electrode surface. At the left, the cyclic rate was 25 mV/s and at the right, the cyclic rate was 100 mV/s in accordance with the principles of the present disclosure.

A 500 μL of PbSe with benzoic acid solution (concentration of the sample=2 mg/mL) were drop-casted into the surface of a glassy carbon electrode. FIG. 6 shows the cyclic voltammograms for the electrochemical reduction process of benzoic acid at 25 mV and at 100 mV/s. The particles are electrochemically active in the region where Pb(II) reduces to metallic lead. This electrochemical process usually occurs in positive potentials. Due to the presence of aromatic ligands, and more specifically, benzoic acid, the electrochemical behavior of the PbSe of the present disclosure occurs in negative potentials. This result indicates that PbSe with benzoic acid is resistant to air and water oxidation.

Due to similar characteristics with benzoic acid, there are several ligands that can be used to synthesize robust and more durable lead selenide in an opened environment in accordance to the present invention. There are several commercially available aromatic ligand exchangers that can be employed for the attachment to a quantum dot core. They have a component that can be used for polymerization. Ligands such as 4-vinylbenzoic acid, 3-vinylbenzoic acid, which have a vinyl group have been known to produce films using electropolymerization at an electrode surface. Also 1-pyrenecarboxylic acid can be used as the capping ligand in accordance to the principles of the present invention.

What is claimed is:

1. A lead selenide capped with an aromatic ligand comprising a particle of lead selenide and benzoic acid as the aromatic ligand capped to said lead selenide.

2. The lead selenide capped with an aromatic ligand according to claim 1, wherein the aromatic ligand is 4-vinylbenzoic acid.

3. The lead selenide capped with an aromatic ligand according to claim 1, wherein the aromatic ligand is 3-vinylbenzoic acid.

4. The lead selenide capped with an aromatic ligand according to claim 1, wherein the aromatic ligand is 1-pyrenecarboxilic acid.

5. The lead selenide capped with an aromatic ligand according to claim 4, wherein the aromatic ligand is 4-vinylbenzoic acid.

6. The lead selenide capped with an aromatic ligand according to claim 4, wherein the aromatic ligand is 3-vinylbenzoic acid.

7. The lead selenide capped with an aromatic ligand according to claim 4, wherein the aromatic ligand is 1-pyrenecarboxilic acid.

8. A lead selenide capped with an aromatic ligand comprising a particle of lead selenide and benzoic acid as the aromatic ligand capped to said lead selenide, whereby the lead selenide's electrochemical behavior occurs in negative potentials.

* * * * *